United States Patent
Harada et al.

(10) Patent No.: US 9,728,409 B2
(45) Date of Patent: Aug. 8, 2017

(54) METHOD OF MANUFACTURING SEMICONDUCTOR DEVICE

(71) Applicant: HITACHI KOKUSAI ELECTRIC INC., Tokyo (JP)

(72) Inventors: Kazuhiro Harada, Toyama (JP); Kimihiko Nakatani, Toyama (JP); Hiroshi Ashihara, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 15/275,576

(22) Filed: Sep. 26, 2016

(65) Prior Publication Data

US 2017/0011926 A1 Jan. 12, 2017

Related U.S. Application Data

(63) Continuation of application No. PCT/JP2014/059246, filed on Mar. 28, 2014.

(51) Int. Cl.
*H01L 21/20* (2006.01)
*H01L 21/4763* (2006.01)
(Continued)

(52) U.S. Cl.
CPC .... *H01L 21/28079* (2013.01); *C01B 21/0763* (2013.01); *C23C 16/34* (2013.01);
(Continued)

(58) Field of Classification Search
CPC . C23C 16/303; C23C 16/34; C23C 16/45523; C23C 16/45529;
(Continued)

(56) References Cited

U.S. PATENT DOCUMENTS 6,207,557 B1  3/2001  Lee et al.
2001/0002334 A1  5/2001  Lee et al.
(Continued)

FOREIGN PATENT DOCUMENTS

JP  2000-068232 A  3/2000
JP  2011-006783 A  1/2011
(Continued)

OTHER PUBLICATIONS

Taiwanese Office Action for Application No. 104100916 dated May 18, 2016.
(Continued)

*Primary Examiner* — Hsien Ming Lee
(74) *Attorney, Agent, or Firm* — Volpe and Koenig, P.C.

(57) ABSTRACT

Provided is a method of manufacturing a semiconductor device, including: forming a stacked metal nitride film including a first metal nitride film and a second metal nitride film on a substrate by alternately performing steps (a) and (b) a plurality of times, wherein the step (a) includes alternately supplying: a first metal source containing a first halogen element and a metal element; and a nitrogen-containing source to the substrate a plurality of times to form the first metal nitride film, and the step (b) includes alternately supplying: a second metal source containing a second halogen element different from the first halogen element and the metal element; and the nitrogen-containing source to the substrate a plurality of times to form the second metal nitride film.

10 Claims, 9 Drawing Sheets

(51) Int. Cl.
  *H01L 21/28*   (2006.01)
  *C23C 16/34*   (2006.01)
  *C23C 16/455*  (2006.01)
  *C01B 21/076*  (2006.01)
  *H01L 21/67*   (2006.01)
  *H01L 21/673*  (2006.01)
  *H01L 21/285*  (2006.01)
  *H01L 29/51*   (2006.01)

(52) U.S. Cl.
  CPC .. *C23C 16/45527* (2013.01); *C23C 16/45529* (2013.01); *H01L 21/28088* (2013.01); *H01L 21/67196* (2013.01); *H01L 21/67389* (2013.01); *H01L 21/28562* (2013.01); *H01L 29/513* (2013.01); *H01L 29/517* (2013.01)

(58) Field of Classification Search
  CPC ........... H01L 21/02458; H01L 21/0254; H01L 21/02538; H01L 21/02521
  USPC .................. 438/584, 642, 648, 656, 685
  See application file for complete search history.

(56) References Cited

U.S. PATENT DOCUMENTS

2012/0261773 A1   10/2012  Ogawa
2013/0065391 A1    3/2013  Ogawa et al.
2014/0242790 A1*   8/2014  Harada ............ H01L 21/28008
                                                            438/592

FOREIGN PATENT DOCUMENTS

JP    2012231123 A    11/2012
JP    2013076157 A     4/2013
TW     201318043 A1    5/2013

OTHER PUBLICATIONS

Japanese Office Action for Application No. 2016-509843 issued on Apr. 13, 2017.

\* cited by examiner

FIG. 8

| TiI$_4$-TiN % | X | Y | Z ||
|---|---|---|---|---|
| | | | EXAMPLE 1 | EXAMPLE 2 |
| 100% | 1 | 0 | 150 | 150 |
| 75% | 3 | 1 | 38 | 38 |
| 50% | 2 | 2 | 38 | 38 |
| 25% | 1 | 3 | 41 | 38 |
| 0% | 0 | 1 | 195 | 175 |

|  | TiI$_4$-TiN | TiCl$_4$-TiN |
|---|---|---|
| Rms [nm] | 0.176 | 0.247 |
| Ra [nm] | 0.137 | 0.186 |
| Rmax [nm] | 2.596 | 2.905 |

METHOD OF MANUFACTURING SEMICONDUCTOR DEVICE

CROSS-REFERENCE TO RELATED PATENT APPLICATION

This non-provisional U.S. patent application claims priority under 35 U.S.C. §119 of International Patent Application No. PCT/JP2014/059246, filed on Mar. 28, 2014, in the WIPO, the entire contents of which are hereby incorporated by reference.

BACKGROUND

1. Field

The present disclosure relates to a method of manufacturing a semiconductor device.

2. Description of the Related Art

As a gate electrode of a transistor such as MOSFET (Metal-Oxide-Semiconductor Field Effect Transistor) or a capacitor electrode of DRAM (Dynamic Random Access Memory), various types of metal films are used.

As a structure of a transistor, a stacked gate structure is known. The stacked gate structure includes a high-k film formed on silicon and a gate electrode formed on the high-k film. As the gate electrode, a metal film containing a metal element is known (refer to Patent Document 1).

RELATED ART DOCUMENT

Patent Document

[Patent Document 1] Japanese Patent Publication No. 2011-6783

A threshold voltage is an important parameter representing a characteristic of a transistor, and determined by a work function of an electrode. The work function differs depending on required device performance. For example, in order to reduce power consumption of an NMOS transistor, a metal film having a lower work function is required. Since the work function differs depending on required device performance, the work function of the metal film needs to be adjusted.

SUMMARY

Described herein is a technique capable of adjusting a work function of a metal film.

According to one aspect described herein, there is provided a method of manufacturing a semiconductor device, including: forming a stacked metal nitride film including a first metal nitride film and a second metal nitride film on a substrate by alternately performing steps (a) and (b) a plurality of times, wherein the step (a) includes alternately supplying: a first metal source containing a first halogen element and a metal element; and a nitrogen-containing source to the substrate a plurality of times to form the first metal nitride film, and the step (b) includes alternately supplying: a second metal source containing a second halogen element different from the first halogen element and the metal element; and the nitrogen-containing source to the substrate a plurality of times to form the second metal nitride film.

According to the technique described herein, it is possible to adjust a work function of a metal film.

BRIEF DESCRIPTION OF THE DRAWINGS

FIG. 8 is a table showing the number of film forming processes when the work function of FIG. 7 is obtained.

DETAILED DESCRIPTION OF THE PREFERRED EMBODIMENTS

First Embodiment

Hereafter, a first embodiment will be described with reference to the accompanying drawings.

First, a substrate processing apparatus used in the first embodiment will be described. Specifically, the substrate processing apparatus is an apparatus for manufacturing a semiconductor device, and used for a process of manufacturing a semiconductor device. Hereafter, a single-wafer type substrate processing apparatus used as the substrate processing apparatus will be exemplified. The single-wafer type substrate processing apparatus performs a process such as a film forming process on one sheet of substrate at a time.

(1) Configuration of Substrate Processing Apparatus

Figure 1:
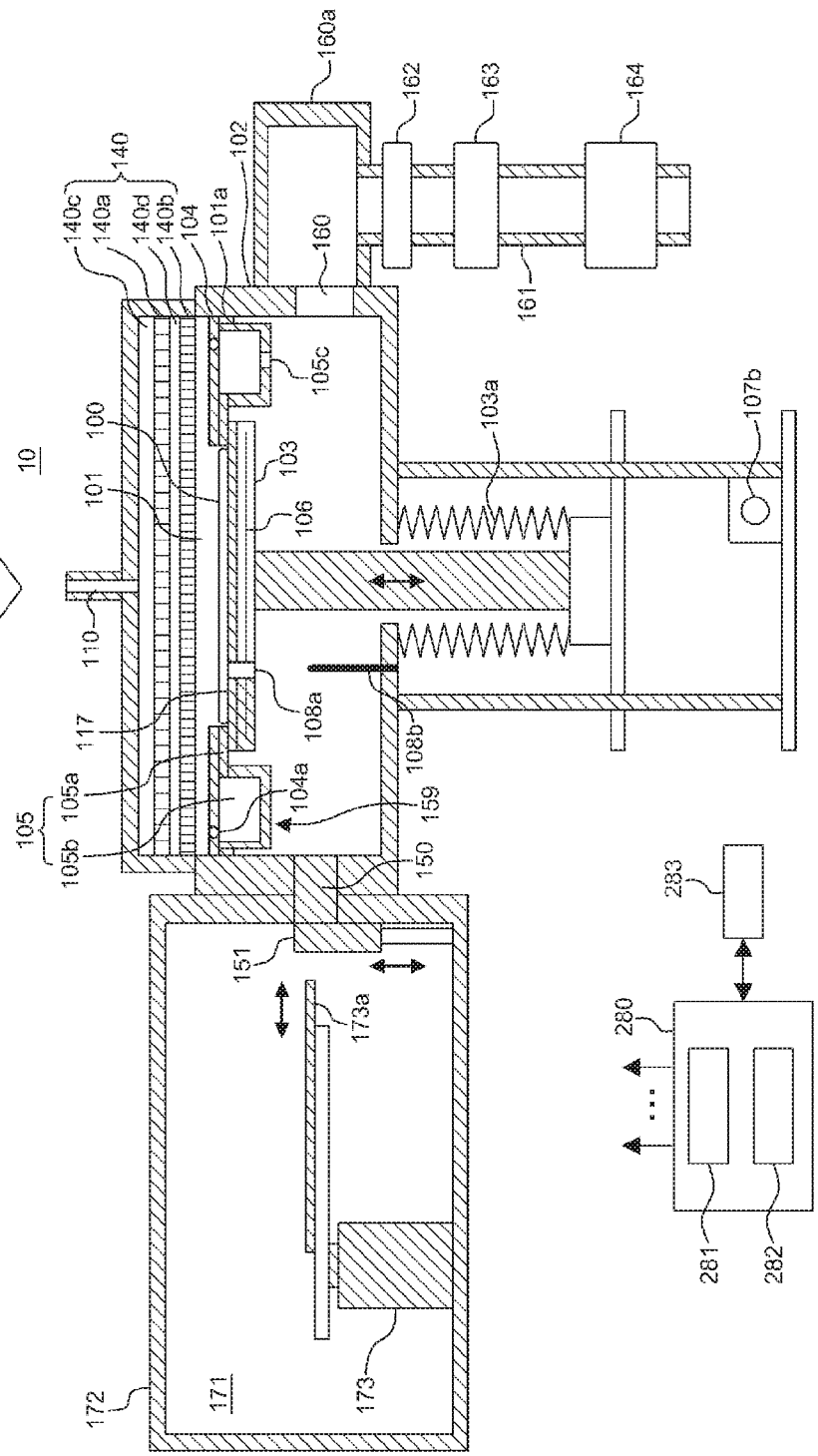
FIG. 1 is a diagram schematically illustrating a substrate processing apparatus which is preferably used in a first embodiment described herein.

FIG. 1 is a diagram schematically illustrating the substrate processing apparatus which is preferably used in the first embodiment.

<Process Chamber>

As illustrated in FIG. 1, the substrate processing apparatus 10 includes a process container 102. The process container 102 has a circular shape when seen from the top, and is a flat airtight container. The process container 102 is constituted of quartz ($SiO_2$) or a metal such as aluminum (Al) or stainless steel (SUS). The process container 102 has a process chamber 101 installed therein. In the process chamber 101, a wafer 100 such as a silicon substrate is processed.

<Support>

A support 103 for supporting the wafer 100 is installed in the process container 102. The support 103 is constituted by quartz ($SiO_2$), carbon, ceramics, silicon carbide (SiC), aluminum oxide ($Al_2O_3$) or aluminum nitride (AlN), for example. The support 103 has a susceptor 117 installed on the upper surface thereof, and the susceptor 117 is a support plate constituted by quartz ($SiO_2$), carbon, ceramics, silicon carbide (SiC), aluminum oxide ($Al_2O_3$) or aluminum nitride (AlN), for example. The wafer 100 is placed on the susceptor 117. The support 103 has a heater 106 embedded therein, the heater 106 serving as a heating unit for heating the wafer 100. The lower end portion (post) of the support 103 penetrates the bottom portion of the process container 102.

<Elevating Mechanism>

An elevating mechanism 107b is connected to the lower end portion of the support 103. As the elevating mechanism 107b is operated to lift/lower the support 103, the wafer 100 supported on the susceptor 117 is lifted/lowered. The support 103 (susceptor 117) is lowered to a position (wafer transfer position) of a wafer transfer port 150 described later when the wafer 100 is transferred, and lifted to a wafer process position (positioned illustrated in FIG. 1) when the wafer 100 is processed. The lower end portion of the support 103 is covered by a bellows 103a. The inside of the process container 102 is sealed.

<Lift Pin>

The process container 102 has a plurality of lift pins 108b, for example, three lift pins 108b installed at the inner bottom of the process container 102. The support 103 (and the susceptor 117) may have a plurality of through-holes 108a through which the respective lift pins 108b are passed, the plurality of through-holes 108a being disposed to positions corresponding to the respective lift pins 108b. When the support 103 is lowered to the wafer transfer position, the upper ends of the lift pins 108 protrude from the upper surface of the susceptor 117 through the through-holes 108a, and the lift pins 108b support the wafer 100 from thereunder. When the support 103 is lifted to the wafer process position, the lift pins 108b are buried from the upper surface of the susceptor 117, and the susceptor 117 supports the wafer 100 from thereunder. Since the lift pins 108 are in direct contact with the wafer 100, the lift pins 207 may be formed of quartz, alumina or the like, for example.

<Wafer Transfer Port>

The wafer transfer port 150 is installed at the inner wall of the process container 102, in order to load the wafer 100 into the process container 102 or unload the wafer 100 out of the process container 102. At the wafer transfer port 150, a gate valve 151 is installed. By opening the gate valve 151, the inside of the process container 102 communicates with the inside of the transfer chamber (preparatory chamber) 171. The transfer chamber 171 is installed in a transfer container (sealed container) 172. The transfer chamber 171 has a transfer robot 173 installed therein, the transfer robot 173 transferring the wafer 100. The transfer robot 173 includes a transfer arm 173a for supporting the wafer 100 when the wafer 100 is transferred.

When the gate valve 151 is opened with the support 130 lowered to the wafer transfer position, the wafer 100 may be transferred between the process container 102 and the transfer chamber 171 by the transfer robot 173. The wafer 100 transferred into the process container 102 is temporarily placed on the lift pins 108b as described above. A load lock chamber (not illustrated) is installed at the opposite side of one side of the transfer container 172, at which the wafer transfer port 150 is installed. The wafer 100 may be transferred between the inside of the load lock chamber and the inside of the transfer chamber 171 by the transfer robot 173. The load lock chamber functions as a preparatory chamber which temporarily houses an unprocessed or processed wafer 100.

<Exhaust System>

An exhaust port 160 serves to exhaust the atmosphere of the process container 102, and is installed in the inner wall of the process container 102 at the opposite side of the wafer transfer port 150. The exhaust port 160 is connected to an exhaust pipe 161 through an exhaust chamber 160a. An APC (Automatic Pressure Controller) 162, a source collection trap 163 and a vacuum pump 164 are sequentially connected in series to the exhaust pipe 161, the APC 162 controlling the inner pressure of the process chamber 101 to a predetermined pressure. The exhaust system (exhaust line) is constituted by the exhaust port 160, the exhaust pipe 161 and the pressure controller 162. The source collection trap 163 and the vacuum pump 164 are generally installed in a semiconductor manufacturing factory where the substrate processing apparatus 10 is installed. However, the source collection trap 163 and the vacuum pump 164 may be directly installed in the substrate processing apparatus 10.

<Gas Inlet Port>

A gas inlet port 110 serves to supply various gases into the process container 102, and is installed at the top of the process container 102 [the upper surface (ceiling) of a shower head 140 described later]. The gas inlet port 110 is connected to a gas supply system described later.

<Shower Head>

The shower head 140 serving as a gas dispersion mechanism is installed between the process chamber 101 and the gas inlet port 110 of the process container 202. The shower head 140 includes a dispersion plate 140a and a shower plate 140b. The dispersion plate 140a disperses a gas introduced through the gas inlet port 110, and the shower plate 140b more uniformly disperses the gas passing through the dispersion plate 140a, such that the dispersed gas is supplied onto the surface of the wafer 100 on the support 103. The dispersion plate 140a and the shower plate 140b have a plurality of holes (not illustrated). The dispersion plate 140a is disposed to face the upper surface of the shower head 140 and the shower plate 140b, and the shower plate 140b is disposed to face the wafer 100 on the support 103. A first buffer space 140c for diffusing a gas supplied through the gas inlet port 110 is disposed between the upper surface of the shower head 140 and the dispersion plate 140a, and a second buffer space 140d for diffusing a gas passing through the dispersion plate 140a is disposed between the dispersion plate 140a and the shower plate 140b.

<Exhaust Duct>

The process chamber 101 has a stepped portion 101a installed on the inner wall thereof. The stepped portion 101a supports a conductance plate 104. The conductance plate 104 is constituted by a ring-shaped plate member having a hole installed at the inner circumference thereof so as to house the wafer 100. The conductance plate 104 has a plurality of exhaust ports 104a arranged along a circumferential direction at predetermined intervals in the outer circumference thereof.

A lower plate 105 is fitted to the outer circumference of the support 103 in the process container 102. The lower plate 105 includes a ring-shaped concave portion 105b and a flange portion 105a installed at the upper portion of the inner circumference of the concave portion 105b, and the concave portion 105b and the flange portion 105a are integrated with each other. The concave portion 105b is installed to block a gap between the outer circumference of the support 103 and the inner wall of the process chamber 101. At a part of the bottom portion of the concave portion 105b around the exhaust port 160, a plate exhaust port 105c is disposed to discharge a gas from the concave portion 105b toward the exhaust port 160. The flange portion 105a functions as a fitting portion which is fitted to the outer circumference of the upper portion of the support 103. As the flange portion 105a is fitted to the outer circumference of the upper portion of the support 103, the lower plate 105 is lifted/lowered with the support 103 while the support 103 is lifted/lowered.

When the support 103 is lifted to the wafer process position, the conductance plate 104 blocks the opening surface at the upper portion of the concave portion 105b of the lower plate 105. Thus, an exhaust duct 159 using the inside of the concave portion 105b as a gas flow path is formed. Considering that reaction products deposited on the inner wall of the exhaust duct 159 are etched (self-cleaned), the conductance plate 104 and the lower plate 105 may be constituted by a material capable of maintaining a high temperature, for example, quartz capable of withstanding a high temperature and a heavy load.

Hereafter, a flow of gas in the process chamber 101 when the wafer 100 is processed will be described. The gas supplied to the shower head 140 through the gas inlet port 110 is supplied into the first buffer space 140c, supplied to the second buffer space 140d through the holes of the dispersion plate 140a, and supplied onto the wafer 100 in the process chamber 101 through the holes of the shower plate 140b. The gas supplied to the wafer 100 is introduced into the exhaust duct 159 formed at the outer circumference of the wafer 100, and exhausted to the outside of the process chamber 101 through the exhaust port 160.

<Gas Supply System>

Figure 2:
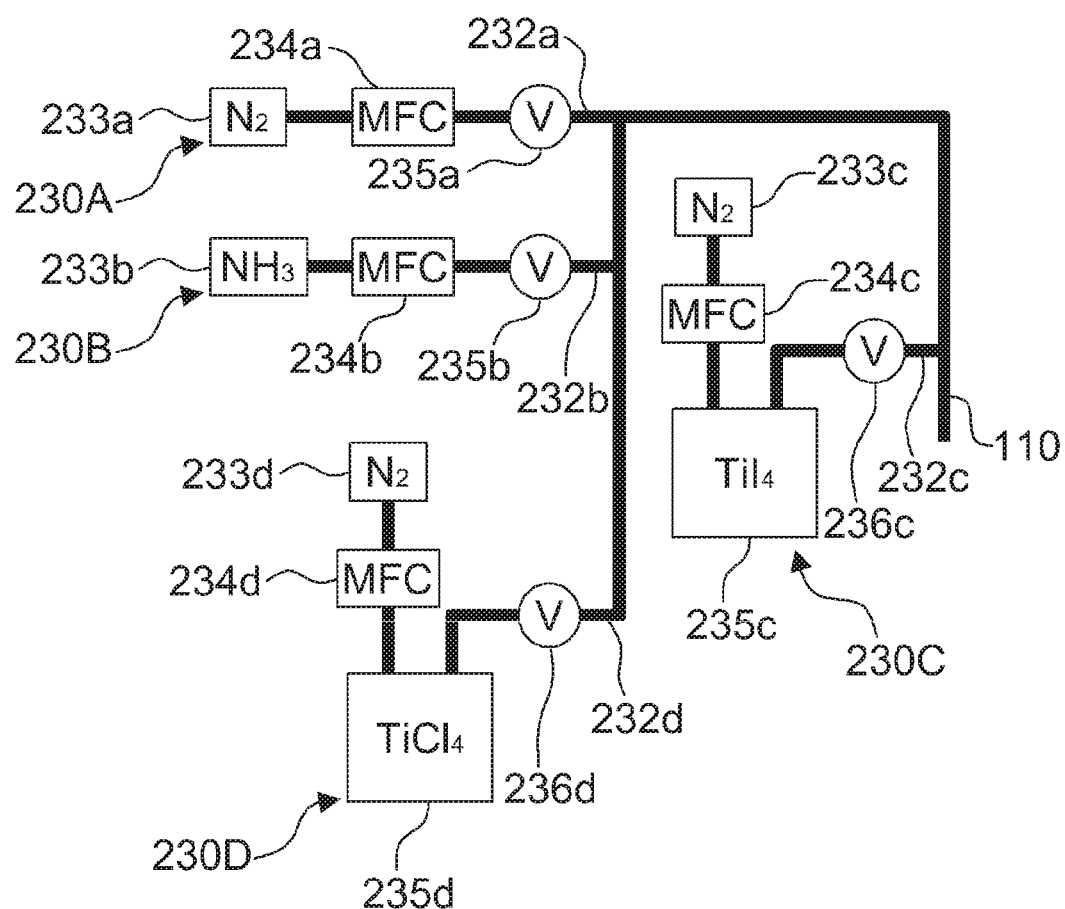
FIG. 2 is a diagram schematically illustrating a gas supply system of the substrate processing apparatus of FIG. 1.

Next, the gas supply system connected to the above-described gas inlet port 110 will be described. FIG. 2 is a diagram schematically illustrating the gas supply system of the substrate processing apparatus 10. The gas supply system of the substrate processing apparatus 10 includes an inert gas supply system 230A, a reactive gas supply system 230B, a first source gas supply system 230C and a second source gas supply system 230D, which are connected to the gas inlet port 110.

(Inert Gas Supply System)

The inert gas supply system 230A is constituted by a gas supply pipe 232a, an inert gas supply source 233a, an MFC 234a and a valve 235a. The downstream side of the gas supply pipe 232a is connected to the gas inlet port 110. The inert gas supply source 233a, the MFC 234a and the valve 235a are sequentially installed at the gas supply pipe 232a from the upstream side toward the downstream side of the gas supply pipe 232a. In the first embodiment, $N_2$ gas is used as the inert gas.

The flow rate of $N_2$ gas supplied to the gas supply pipe 232a from the inert gas supply source 233a is adjusted, and the $N_2$ gas with the adjust flow rate is supplied to the gas inlet port 110 through the valve 235a. As the inert gas, rare gases such as helium (He) gas, neon (Ne) gas, argon (Ar) gas, krypton (Kr) gas and xenon (Xe) gas as well as the $N_2$ gas may be used.

[Reactive Gas Supply System (Nitrogen-Containing Source Supply System)]

The reactive gas supply system 230B is constituted by a gas supply pipe 232b, a reactive gas supply source 233b, an MFC 234b and a valve 235b. The downstream side of the gas supply pipe 232b is connected to the gas inlet port 110. The reactive gas supply source 233b, the MFC 234b and the valve 235b are sequentially installed at the gas supply pipe 232b from the upstream side toward the downstream side of the gas supply pipe 232b. The reactive gas is a nitrogen-containing source, and used as a nitridation source. In the first embodiment, ammonia ($NH_3$) is used as a nitrogen-containing source.

The flow rate of $NH_3$ gas supplied to the gas supply pipe 232b from the reactive gas supply source 233b is adjusted by the MFC 234b, and the $NH_3$ gas with the adjusted flow rate is supplied to the gas inlet port 110 through the valve 235b.

As the reactive gas, $N_2$ gas, nitrous oxide (NO), nitric oxide ($N_2O$) and the like may be used, in addition to the $NH_3$ gas.

[First Source Gas Supply System (First Metal Material Supply System)]

A first metal material is supplied through a first source gas supply system 230C. First, the first metal material will be described. The first metal material contains a first halogen element and a predetermined metal element. The first halogen element includes a halogen element having a higher atomic number than a second halogen element described later. Preferably, the first halogen element contains a halogen element having a higher atomic number than chlorine (Cl), and includes one of brome (Br), iodine (I) and astatine (At). The predetermined metal element includes a transition metal element, for example. In the first embodiment, iodine (I) is used as the first halogen element, and titanium (Ti) which is a transition metal element is used as the predetermined metal element. That is, in the first embodiment, titanium iodide [titanium tetraiodide ($TiI_4$)] is used as the metal material.

The first source gas supply system 230C is constituted by a gas supply pipe 232c, a carrier gas supply source 233c, an MFC 234c, a first source supply source 235c and a valve 236c. The downstream side of the gas supply pipe 232c is connected to the gas inlet port 110. The carrier gas supply source 233c, the MFC 234c, the first source supply source 235c and the valve 236c are sequentially installed at the gas supply pipe 232c from the upstream side toward the downstream side of the gas supply pipe 232c. As the carrier gas, $N_2$ gas is used, for example. The first source supply source 235c may include a vaporizer, for example.

The flow rate of the carrier gas supplied to the gas supply pipe 232c from the carrier gas supply source 233c is adjusted by the MFC 234c, and the carrier gas with the adjusted flow rate is supplied to the first source supply source 235c. The solid $TiI_4$ held in the first source supply source 235c is vaporized, and the vaporized gas is supplied with a carrier gas to the gas inlet port 110 through the valve 236c. $TiI_4$ is in a solid state at normal temperature and pressure, and vaporized by heating the first source supply source 235c at a predetermined temperature (for example, 120° C.).

In the above-describe example, iodine (I) is used as the first halogen element. However, brome (Br) and astatine (At) may be used as the first halogen element. Furthermore, titanium (Ti) which is a transition metal element is used as the predetermined metal element, but the present embodiment is not limited thereto. For example, the predetermined metal element may selected from a group consisting of tungsten (W), tantalum (Ta), zirconium (Zr), hafnium (Hf), ruthenium (Ru), cobalt (Co) and nickel (Ni). Moreover, the predetermined metal element may include metal elements other than the transition metal element.

[Second Source Gas Supply System (Second Metal Source Supply System)]

A second metal source is supplied through a second source gas supply system 230D. The second metal source contains a second halogen element different from the above-described first halogen element and the above-described predetermined metal element. The second halogen element includes a halogen element having a lower atomic number than the first halogen element. Preferably, the second halogen element includes chlorine (Cl) or fluorine (F) which is a halogen element having a lower atomic number than Cl. In the first embodiment, Cl having a lower atomic number than iodine (I) used as the first halogen element is used as the second halogen element. The predetermined metal element contained in the second metal source includes titanium (Ti) which is a metal element contained in the first metal source.

That is, in the first embodiment, titanium chloride [tetrachloro titanium ($TiCl_4$)] is used as the second metal source.

The second source gas supply system 230D is constituted by a gas supply pipe 232d, a carrier gas supply source 233d, an MFC 234d, a second source supply source 235d and a valve 236d. The downstream side of the gas supply pipe 232d is connected to the gas inlet port 110. The carrier gas supply source 233d, the MFC 234d, the second source supply source 235d and the valve 236d are sequentially installed at the gas supply pipe 232d from the upstream side toward the downstream side of the gas supply pipe 232d. As the carrier gas, $N_2$ gas is used, for example. The second source supply source 235d may include a bubbler.

The flow rate of the carrier gas supplied to the gas supply pipe 232c from the carrier gas supply source 233d is adjusted by the MFC 234d, and the carrier gas with the adjusted flow rate is supplied to the second source supply source 235d. $TiCl_4$ is in a liquid state at normal temperature and pressure, and is held as liquid in the second source supply source 235d. $TiCl_4$ held in the second source supply source 235d is vaporized by the carrier gas supplied to the second source supply source 235d, and supplied with the carrier gas to the gas inlet port 110 through the valve 236d. By heating the second source supply source 235d, the vapor pressure of $TiCl_4$ in the second source supply source 235d may be sufficiently raised to vaporize and supply $TiCl_4$. In this case, the second source supply source 235d does not need to include a bubbler.

(Controller)

As illustrated in FIG. 1, the substrate processing apparatus 10 includes a controller (control unit) 280 for controlling the operations of the components of the substrate processing apparatus 10. The controller 280 includes at least an arithmetic unit 281 and a memory unit 282. The controller 280 is connected to the components described above, calls a program or recipe from the memory unit 282 according to an instruction of an upper controller (not illustrated) or user, and controls the operations of the components according to the contents of the program or recipe. Specifically, the controller 280 controls the components such as the heater 106, the elevating mechanism 107b, the gate valve 151, the APC 162, the vacuum pump 164, the transfer robot 173 and the valves and MFCs of the gas supply system.

The controller 280 may be embodied by a dedicated computer or a universal computer. For example, an external memory device 283 storing the above-described program may be prepared, and a program may be installed in a universal computer through the external memory device 283, in order to embody the controller 280 according to the first embodiment. The external memory device 283 may include a magnetic disk such as a magnetic tape, flexible disk and hard disk, an optical disk such as CD and DVD, a magneto-optical disk such as MO, and a semiconductor memory such as a USB memory and memory card.

The unit for supplying a program to the computer is not limited to the external memory device 283. For example, the program may be supplied through a communication unit such as the Internet and a dedicated line, without the external memory device 283. The memory unit 282 and the external memory device 283 are embodied as transitory computer readable recording media. Hereafter, they are collectively referred to as recording media. In this specification, "recording media" may indicate only the memory unit 282, indicate only the external memory device 283, or indicate both of the memory unit 282 and the external memory device 283.

<Configuration of Semiconductor Device>

Next, a gate of a transistor (semiconductor device) formed by the substrate processing apparatus 10 will be described. In the following descriptions, an NMOS transistor will be exemplified.

Figure 3:
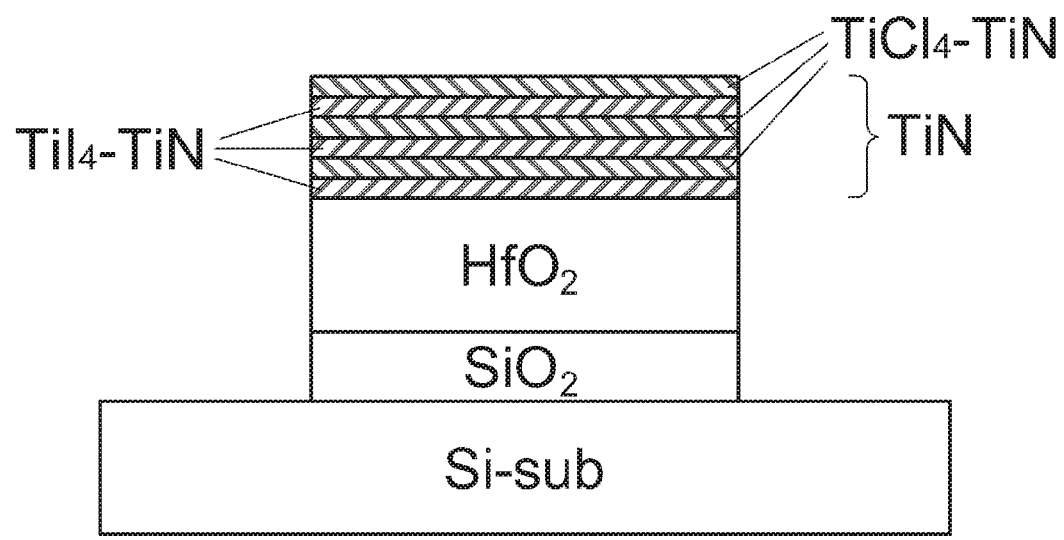
FIG. 3 is a diagram exemplifying a gate of a transistor formed by the substrate processing apparatus of FIG. 1.

FIG. 3 is a diagram exemplifying a gate of a transistor formed by the substrate processing apparatus 10, illustrating a gate of an NMOS transistor. As illustrated in FIG. 3, the gate includes a stacked structure of a silicon insulation film, a high-k film, and a gate electrode. The silicon insulation film is formed on a silicon substrate and constituted by silicon oxide ($SiO_2$), the high-k film is formed on the silicon insulation film and constituted by hafnium oxide ($HfO_2$), and the gate electrode is formed on the high-k film and constituted by a metal oxide film (TiN film). In the first embodiment, the TiN film serving as the gate electrode includes a stacked structure of a first metal nitride film (first TiN film) and a second metal nitride film (second TiN film). The first metal nitride film is formed of $TiI_4$ and represented by $TiI_4$—TiN in FIG. 3, and the second metal nitride film is formed of $TiCl_4$ and represented by $TiCl_4$—TiN in FIG. 3.

<Gate Manufacturing Step for Semiconductor Device>

Figure 4:
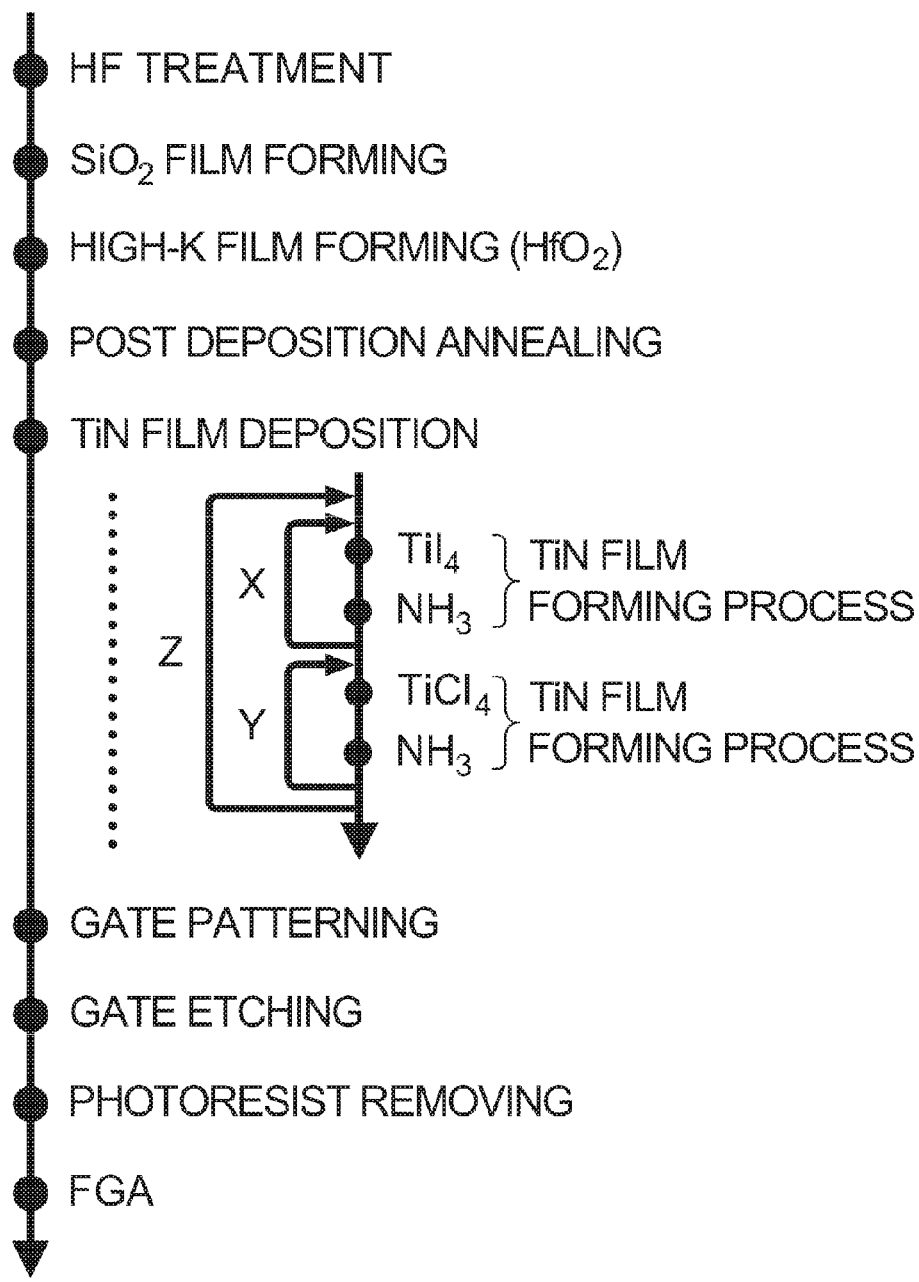
FIG. 4 is a flowchart exemplifying a process of manufacturing the gate of the transistor illustrated in FIG. 3.

Next, a step of manufacturing the gate of the transistor illustrated in FIG. 3 will be described. FIG. 4 is a diagram exemplifying the step of manufacturing the gate of the transistor illustrated in FIG. 3.

As illustrated in FIG. 4, a victim oxide film formed on the silicon substrate is removed by treating the silicon substrate with 1% HF aqueous solution (HF treatment step). Next, a silicon oxide film ($SiO_2$ film) is formed on the silicon substrate through thermal oxidation ($SiO_2$ film forming step). The $SiO_2$ film is formed as an interface layer between the silicon substrate and a hafnium oxide film ($HfO_2$ film) which is subsequently formed.

Next, the hafnium oxide film ($HfO_2$ film) is formed as a high-k film on the $SiO_2$ film (high-k film forming step). The gate insulation film is constituted by the $SiO_2$ film and the $HfO_2$ film. After the $HfO_2$ film is formed, an annealing process is performed (post deposition annealing step). The annealing process is performed in order to remove impurities in the $HfO_2$ film and densify or crystallize the $HfO_2$ film. Then, a metal nitride (TiN) film is formed as a gate electrode on the $HfO_2$ film (TiN film deposition step). As illustrated in FIG. 4, the TiN film deposition step includes a TiN film forming process using $TiI_4$ as a source and a TiN film forming process using $TiCl_4$ as a source. Specifically, the TiN film deposition step includes a step of performing a TiN film forming process of supplying $TiI_4$ and $NH_3$ to the wafer 100 X times (first number of times) (first TiN film forming step) and a step of performing a TiN film forming process of supplying $TiCl_4$ and $NH_3$ to the wafer 100 Y times (second number of times) (second TiN film forming step). By alternately performing the first and second TiN film forming steps Z times (third number of times), a stacked metal nitride film (stacked TiN film) is formed. The forming of the stacked metal nitride film will be described in detail later. In this specification, "stacked metal nitride film" indicates a metal nitride film which is formed by stacking a predetermined number of metal nitride films which are formed through different sources but contain the same metal element. That is, the stacked TiN film is formed by stacking a predetermined number of TiN films which are formed through different sources.

Next, patterning is performed through a photolithography technique using a photoresist as a mask (gate patterning step), and pattern etching is performed through a dry etching technique (gate etching step). Then, the photoresist is removed (photoresist removing step). Then, FGA (Forming Gas Annealing) such as hydrogen gas annealing is performed (FGA step).

When a work function of the TiN film serving as the gate electrode is measured, TiN may be further formed on the TiN film through PVD (Physical Vapor Deposition), for example, in order to secure a film thickness required for measuring the work function. In this case, the forming of the TiN film through PVD is performed before the gate etching step. Furthermore, an aluminum layer may be further formed as a back contact on the back surface of the silicon substrate, after the FGA step.

(2) Substrate Processing Step

Next, the above-described stacked TiN film forming step (TiN film deposition step of FIG. 4) will be described in detail. In the following descriptions, the respective units constituting the substrate processing apparatus 10 are controlled by the controller 280.

Figure 5:
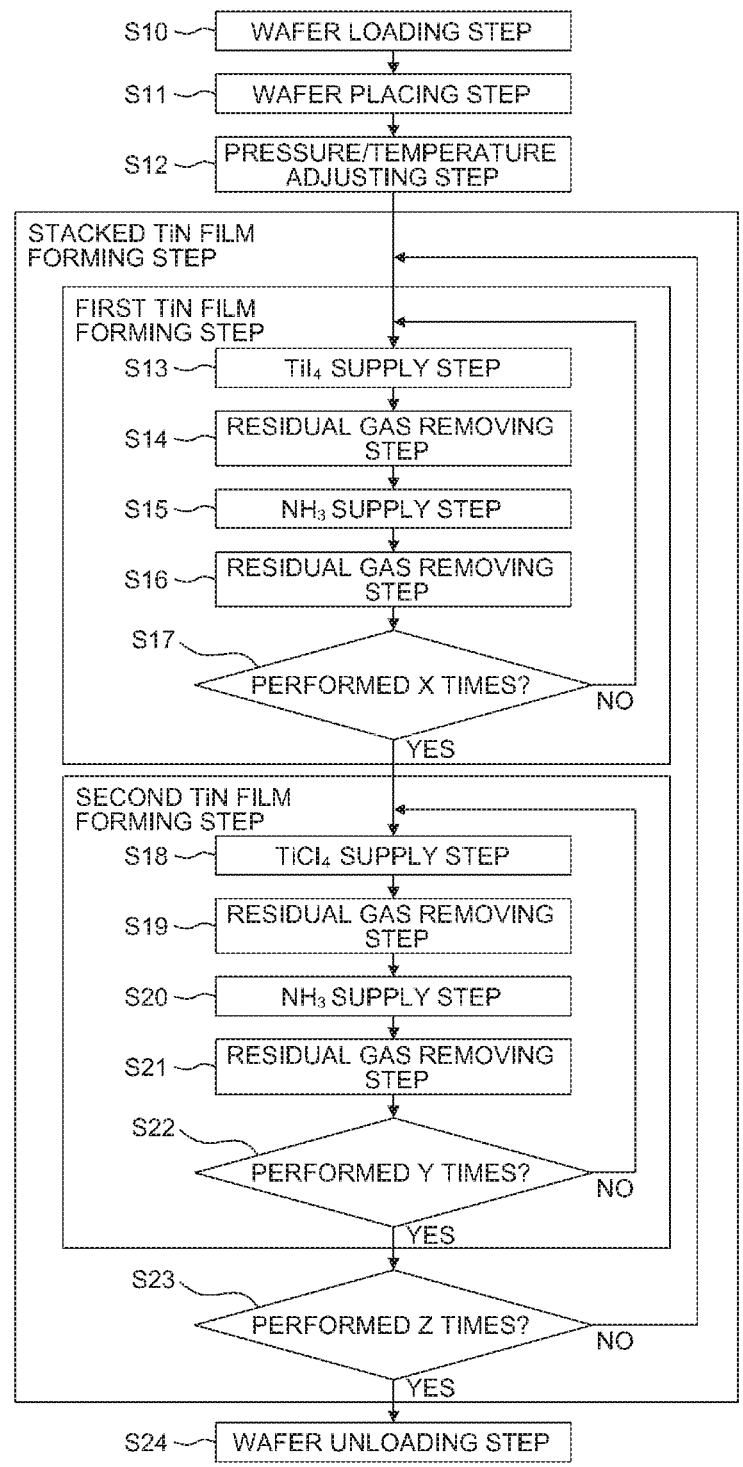
FIG. 5 is a flowchart exemplifying a metal nitride film forming step in the flowchart exemplified in FIG. 4.
Figure 6:
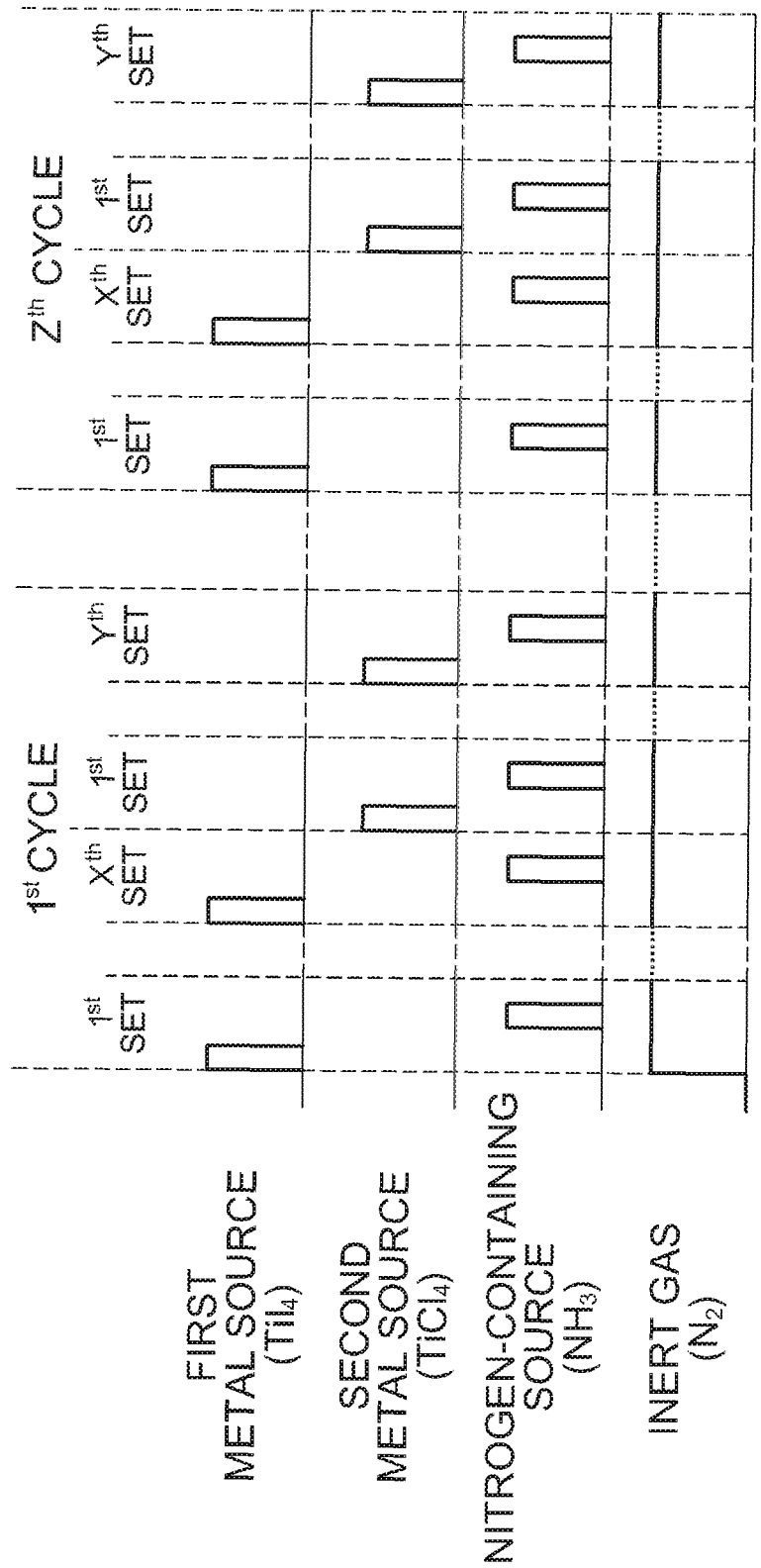
FIG. 6 is a diagram illustrating gas supply timings of the film forming step in FIG. 5.

FIG. 5 is a flowchart exemplifying the stacked metal nitride film (TiN film) forming step (TiN film deposition step) in the process flow illustrated in FIG. 4. FIG. 6 is a diagram illustrating gas supply timings of the film forming step illustrated in FIG. 5.

In this specification, "wafer" indicates "a wafer itself", or indicates "a stacked body (aggregate) of the wafer and a predetermined film or layer formed on the wafer". That is, the wafer and the predetermined layer or film formed on the surface of the wafer may be collectively referred to as the wafer. In this specification, "surface of wafer" indicates "a surface (exposed surface) of a wafer" or "the surface of a predetermined layer or film formed on the wafer, i.e. the uppermost surface of the wafer as a stacked body".

Thus, in this specification, "supplying a predetermined gas onto a wafer" may indicate "directly supplying the predetermined gas onto a surface (exposed surface) of the wafer", or indicate "supplying the predetermined gas onto a layer or film formed on the wafer, i.e. the uppermost surface of the wafer as a stacked body". In this specification, "forming a predetermined film or layer on a wafer" may indicate "directly forming the predetermined film or layer on the surface (exposed surface) of the wafer", or indicate "forming the predetermined film or layer on a film or layer formed on the wafer, i.e. the uppermost surface of the wafer as a stacked body".

Furthermore, when a term "substrate" is used in this specification, it may indicate that a term "wafer" is used. In this case, the wafer may be replaced with the substrate.

(Wafer Loading Step S10)

First, the gate valve 151 installed at the wafer transfer port 150 is opened, and the wafer 100 is loaded into the process container 102 from the transfer chamber 171 by the transfer robot 173. The wafer 100 loaded into the process container 102 has the above-described high-k (HfO$_2$) film formed thereon in advance. As the high-k film, any one or combinations of an aluminum oxide film (AlO film), a zirconium oxide film (ZrO film), a lanthanum oxide film (LaO film), a yttrium oxide film (YO film), a tantalum oxide film (TaO film), a cerium oxide film (CeO film), a titanium oxide film (TiO film), a strontium titanate film (STO film) and a barium titanate film (BTO film) may be used, in addition to the HfO$_2$ film. Furthermore, a film obtained by adding a silicon oxide film (SiO film) or silicon nitride film (SiN film) to the high-k film may be used as the high-k film.

(Wafer Placing Step S11)

The wafer 100 loaded into the process container 102 is placed on the lift pins 108b. The support 103 is lifted to the wafer process position, such that the wafer 100 is placed on the susceptor 117.

(Pressure and Temperature Adjusting Step S12)

When the wafer 100 is placed on the susceptor 117, the gate valve 151 is closed, and the process chamber 101 is vacuum-exhausted by the vacuum pump 164 such that inner pressure of the process chamber 101 becomes a desired pressure (degree of vacuum). At this time, the inner pressure of the process chamber 101 is measured by a pressure sensor (not illustrated), and feedback-controlled by the APC 162.

The wafer 100 placed on the susceptor 117 is heated to a predetermined temperature by the heater 106 embedded in the support 103. The process container 102 has a temperature sensor (not illustrated) installed therein. Based on temperature information sensed by the temperature sensor, the amount of power supplied to the heater 106 is feedback-controlled until the temperature of the wafer 100 reaches the predetermined temperature.

The above-described pressure and temperature adjusting step may be continuously performed until the stacked TiN film forming step described later is ended.

Next, the above-described stacked TiN film forming step is performed. The stacked TiN film forming step includes a step of forming a first TiN film using TiI$_4$ as a source (first TiN film forming step) and a step of forming a second TiN film using TiCl$_4$ as a source (second TiN film forming step).

<First TiN Film Forming Step>

At the first TiN film forming step, the following five steps are sequentially performed.

(TiI$_4$ Supply Step S13)

At a TiI$_4$ supply step S13, TiI$_4$ is supplied as a first metal source into the process chamber 101. Specifically, when the valve 236d of the gas supply pipe 232c is opened, N$_2$ gas is supplied as a carrier gas into the first source supply source 235c. At this time, the flow rate of the carrier gas supplied to the first source supply source 235c is adjusted by the MFC 234c. The TiI$_4$ vaporized in the first source supply source 235c is supplied as TiI$_4$ gas having a predetermined flow rate with the carrier gas into the process chamber 101. At this time, the valve 235a of the inert gas supply system 230A may be opened to supply N$_2$ gas from the inert gas supply source 233a with the TiI$_4$ gas into the process chamber 101.

At the step S13, the inner pressure of the process chamber 101, adjusted by the APC 162, may range from 20 Pa to 1,330 Pa. The flow rate of TiI$_4$ gas, controlled by the MFC 234c (and the heater for heating the first source supply source 235c), may range from 1 sccm to 200 sccm. When N$_2$ gas is supplied from the inert gas supply system 230A with TiI$_4$ gas, the flow rate of N$_2$ gas, controlled by the MFC 234a, may range from 0.1 sccm to 2,000 sccm.

The time duration during which the wafer 100 is exposed to TiI$_4$ gas, that is, the gas supply time duration (irradiation time duration) may range from 0.01 second to 300 seconds. At this time, the heater 106 may be controlled to adjust the temperature (process temperature) of the wafer 100 to a temperature of 350° C. to 400° C., or preferably a temperature of 400° C. By supplying the TiI$_4$ gas, a Ti-containing layer having a thickness of one atomic layer to several atomic layers, for example, is formed on the wafer 100.

(Residual Gas Removing Step S14)

At a residual gas removing step S14, the valve 236c is closed to stop supplying the TiI$_4$ gas to the process chamber 101. At this time, the APC 162 is opened to vacuum exhaust the inside of the process chamber 101 through the vacuum pump 164. Then, unreacted TiI$_4$ gas remaining in the process chamber 101 or the TiI$_4$ gas having contributed to forming the Ti-containing layer is removed from the process chamber 101. At this time, the valve 235a is opened to supply N$_2$ gas into the process chamber 101. Since the N$_2$ gas serves as a purge gas, the TiI$_4$ gas remaining in the process chamber 101 can be more efficiently removed from the process chamber 101. As the N$_2$ gas is supplied at a flow rate of 2,000 sccm for one second to 60 seconds, purge is performed.

(NH$_3$ Supply Step S15)

At an NH$_3$ supply step S15, NH$_3$ gas is supplied as a reactive gas into the process chamber 101. Specifically, the valve 235b of the gas supply pipe 232b is opened to supply NH$_3$ gas stored in the reactive gas supply source 233b to the gas supply pipe 232b. The flow rate of NH$_3$ gas supplied through the gas supply pipe 232b is adjusted by the MFC 234b. The NH$_3$ gas with the adjusted flow rate is supplied into the process chamber 101 through the gas inlet port 110. At this time, the valve 235a of the inert gas supply system 230A may be opened to supply N$_2$ gas from the inert gas supply source 233a with the NH$_3$ gas into the process chamber 101.

At the step S15, the inner pressure of the process chamber 101, adjusted by the APC 162, may range from 20 Pa to 1,330 Pa. The flow rate of NH$_3$ gas, controlled by the MFC 234b, may range from 10 sccm to 3,000 sccm. When N$_2$ gas is supplied from the inert gas supply system 230A with the NH$_3$ gas, the flow rate of the N$_2$ gas, controlled by the MFC 234a, may range from 0.1 sccm to 2,000 sccm.

The time duration during which the wafer 100 is exposed to the NH$_3$ gas, that is, the gas supply time duration (irradiation time duration) may range from 0.01 second to 300 seconds. At this time, the heater 106 may be controlled to adjust the temperature (process temperature) of the wafer 100 to a temperature of 350° C. to 400° C., or preferably a temperature of 400° C.

The NH$_3$ gas supplied into the process chamber 101 reacts with at least a part of the Ti-containing layer formed on the wafer 100 at the step S13. Then, the Ti-containing layer is nitrided to form the first TiN film.

(Residual Gas Removing Step S16)

At a residual gas removing step S16, the valve 23b is closed to stop supplying the NH$_3$ gas to the process chamber 101. At this time, the APC 162 is opened to vacuum exhaust the inside of the process chamber 101 through the vacuum pump 164. Then, unreacted NH$_3$ gas remaining in the process chamber 101 or the NH$_3$ gas having contributed to nitriding the Ti-containing layer is removed from the process chamber 101. At this time, the valve 235a is opened to supply N$_2$ gas into the process chamber 101. Since the N$_2$ gas serves as a purge gas, the NH$_3$ gas remaining in the process chamber 101 can be more efficiently removed from the process chamber 101. While the N$_2$ gas is supplied at a flow rate of 2,000 sccm for one second to 60 seconds, purge is performed.

(Process Number Determination Step S17)

A process number determination step S17 includes determining whether a cycle including the above-described steps S13 through S16 was performed a first number of times (X times) (whether a set of steps S13 through S16 was performed Y times) and repeating the cycle including the steps S13 through S16 until it is determined that the cycle was performed the first number of times (X times). Here, X represents an integer equal to or more than 1. By performing the cycle including the steps S13 through S16 X times, the first TiN film forming step is completed. By forming the cycle including the steps S13 through S16 one or more times, a TiN film (first TiN film) having a predetermined thickness of 0.01 nm to 20 nm is formed. In the above descriptions, supplying the NH$_3$ gas before supplying the TiI$_4$ gas has been exemplified. However, the TiI$_4$ gas may be supplied before the NH$_3$ gas is supplied.

<Second TiN Film Forming Step>

When the first TiN film forming step is completed, the second TiN film forming step is subsequently performed. At the second TiN film forming step, the following five steps are sequentially performed.

(TiCl$_4$ Supply Step S18)

At a TiCl$_4$ supply step S18, TiCl$_4$ is supplied as a second metal source into the process chamber 101. Specifically, the valve 236d of the gas supply pipe 232d is opened to supply N$_2$ gas as a carrier gas into the second source supply source 235d. At this time, the flow rate of the carrier gas supplied to the second source supply source 235d is adjusted by the MFC 234d. The TiCl$_4$ held in the second source supply source 235d is vaporized by the carrier gas supplied to the second source supply source 235d, and the vaporized TiCl$_4$ gas is supplied with the carrier gas into the process chamber 101 through the valve 236d. At this time, the valve 235a of the inert gas supply system 230A may be opened to supply N$_2$ gas from the inert gas supply source 233a with the TiCl$_4$ gas into the process chamber 101.

At the step S18, the inner pressure of the process chamber 101, adjusted by the APC 162, may range from 20 Pa to 1,330 Pa. The flow rate of the TiCl$_4$ gas, controlled by the MFC 234d, may range from 1 sccm to 200 sccm. When N$_2$ gas is supplied from the inert gas supply system 230A with the TiCl$_4$ gas, the flow rate of the N$_2$ gas, controlled by the MFC 234a, may range from 0.1 sccm to 2,000 sccm.

The time duration during which the wafer 100 is exposed to the TiCl$_4$ gas, that is, the gas supply time duration (irradiation time duration) may range from 0.01 second to 300 seconds. At this time, the heater 106 may be controlled to adjust the temperature (process temperature) of the wafer 100 to a temperature of 350° C. to 400° C., or preferably a temperature of 400° C. By supplying the TiCl$_4$ gas, a Ti-containing layer having a thickness of one atomic layer to several atomic layers, for example, is formed on the wafer 100.

(Residual Gas Removing Step S19)

At a residual gas removing step S19, the valve 236d is closed to stop supplying the TiCl$_4$ gas into the process chamber 101. At this time, the APC 162 is opened to vacuum exhaust the inside of the process chamber 101 through the vacuum pump 164. Then, unreacted TiCl$_4$ gas remaining in the process chamber 101 or the TiCl$_4$ gas having contributed to forming the Ti-containing layer is removed from the process chamber 101. At this time, the valve 235a is opened to supply N$_2$ gas into the process chamber 101. Since the N$_2$ gas serves as a purge gas, the TiCl$_4$ gas remaining in the process chamber 101 can be more efficiently removed from the process chamber 101. While the N$_2$ gas is supplied at a flow rate of 2,000 sccm for one second to 60 seconds, purge is performed.

(NH$_3$ Supply Step S20)

At an NH$_3$ supply step S20, NH$_3$ gas is supplied as a reactive gas into the process chamber 101, similar to the above-described step S15. Since the specific operation or supply condition is the same as the step S15, the descriptions of the step S20 are omitted herein. The NH$_3$ gas supplied into the process chamber 101 at the NH$_3$ supply step S20 reacts with at least a part of the Ti-containing layer formed on the wafer 100 at the step S18. Then, the Ti-containing layer is nitrided to form the second TiN film.

(Residual Gas Removing Step S21)

At a residual gas removing step S21, the $NH_3$ gas remaining in the process chamber 101 is removed from the process chamber 101, similar to the above-described step S16. Since the specific operation or supply condition is the same as the step S16, the descriptions thereof are omitted herein.

(Process Number Determination Step S22)

A process number determination step S22 includes determining whether a cycle including the above-described steps S18 through S21 was performed a second number of times (Y times) (whether a set of steps S18 through S21 was performed Y times), and repeating the cycle including the steps S18 through S21 until it is determined that the cycle was performed the second number of times (Y times). Here, Y represents an integer equal to or more than 1. By performing the cycle including the steps S18 through S21 Y times, the second TiN film forming step is completed. By forming the cycle including the steps S18 through S21 one or more times, a TiN film (second TiN film) having a predetermined thickness of 0.01 nm to 20 nm is formed. In the above descriptions, supplying the $TiCl_4$ gas before supplying the $NH_3$ gas has been exemplified. However, the $NH_3$ gas may be supplied before the $TiCl_4$ gas is supplied.

(Process Number Determination Step S23)

When the second TiN film forming step is completed, a process number determination step S23 is performed. The process number determination step S23 includes determining whether a cycle including the first and second TiN film forming steps was performed a third number of times (Z times) (whether a set of the first and second TiN film forming steps was performed Z times), and repeating the first TiN film forming step (steps S13 through S17) and the second TiN film forming step (step S18 through S22) until it is determined that the cycle was performed the third number of times (Z times). Here, Z represents an integer equal to or more than 1. As the cycle including the first and second TiN film forming steps is performed Z times, the stacked TiN film forming step is completed. By performing the cycle one or more times, the cycle including the first TiN film forming step using $TiI_4$ as a source and the second TiN film forming step using $TiCl_4$ as a source, a stacked TiN film having a predetermined thickness of 0.02 nm to 40 nm is formed, wherein the first and second TiN film forming steps are alternately performed. In the present embodiment, the film forming step using $TiCl_4$ as a source is performed after the film forming step using $TiI_4$ as a source. However, the film forming step using as $TiI_4$ a source may be performed after the film forming step using $TiCl_4$ as a source. Preferably, however, the film forming step using $TiCl_4$ as a source may be performed after the film forming step using $TiI_4$ as a source. The reason will be described later.

(Wafer Unloading Step S24)

When the stacked TiN film forming step is completed, a wafer unloading step S24 is performed. At the wafer unloading step S24, the support 103 is lowered, the gate valve 151 is opened, and the processed wafer 100 is unloaded to the outside of the process container 102 by the transfer robot 173.

At the stacked TiN film forming step, the work function of the stacked TiN film serving as the gate electrode may be adjusted to an arbitrary value according to the number of times that the first TiN film forming step from the step S13 through the step S17 is performed (X or a multiplication value of X and Z) and the number of times that the second TiN film forming step from the step S18 through the step S22 is performed (Y or a multiplication value of Y and Z). That is, the work function of the stacked TiN film may be adjusted to an arbitrary value according to the ratio of the first TiN film to the second TiN film, wherein the first TiN film is formed by using $TiI_4$ contained in the stacked TiN film as a source and the second TiN film is formed by using $TiCl_4$ as a source. Hereafter, the reason will be described.

The inventor of this application found that the first and second TiN films have different work functions. Specifically, the inventor found that the work function of the first TiN film is lower than the work function of the second TiN film. The reason that the work function of the first TiN film is lower than the work function of the second TiN film is because iodine (i) and chlorine (Cl) remain in the first and second TiN films, but the work functions of I and Cl are different from each other (the work function of I is lower than the work function of Cl). Since the ratio of I contained in the first TiN film is lower than the ratio of Cl contained in the second TiN film (this reason will be described later), the work function of the first TiN film is higher than the specific work function of titanium (Ti) but has a value close to the specific work function of Ti, and the work function of the first TiN film is lower than the work function of the second TiN film. Furthermore, when $TiI_4$ is used, the halogen element may diffuse in a direction to lower the work function, and a fixed charge at the interface between the $SiO_2$ film and the $HfO_2$ film may be changed. This is considered as one of the reasons that the work function of the first TiN film is lower than the work function of the second TiN film. For these reasons, by adjusting the ratio of the first and second TiN films included in the stacked TiN film, the work function of the stacked TiN film may be adjusted to an arbitrary value between the specific work function of the first TiN film to the specific work function of the second TiN film. The work function of each element may be calculated by using a measured value or theoretical value of the work function and electronegativity correlated with the work function as indexes.

Figure 7:
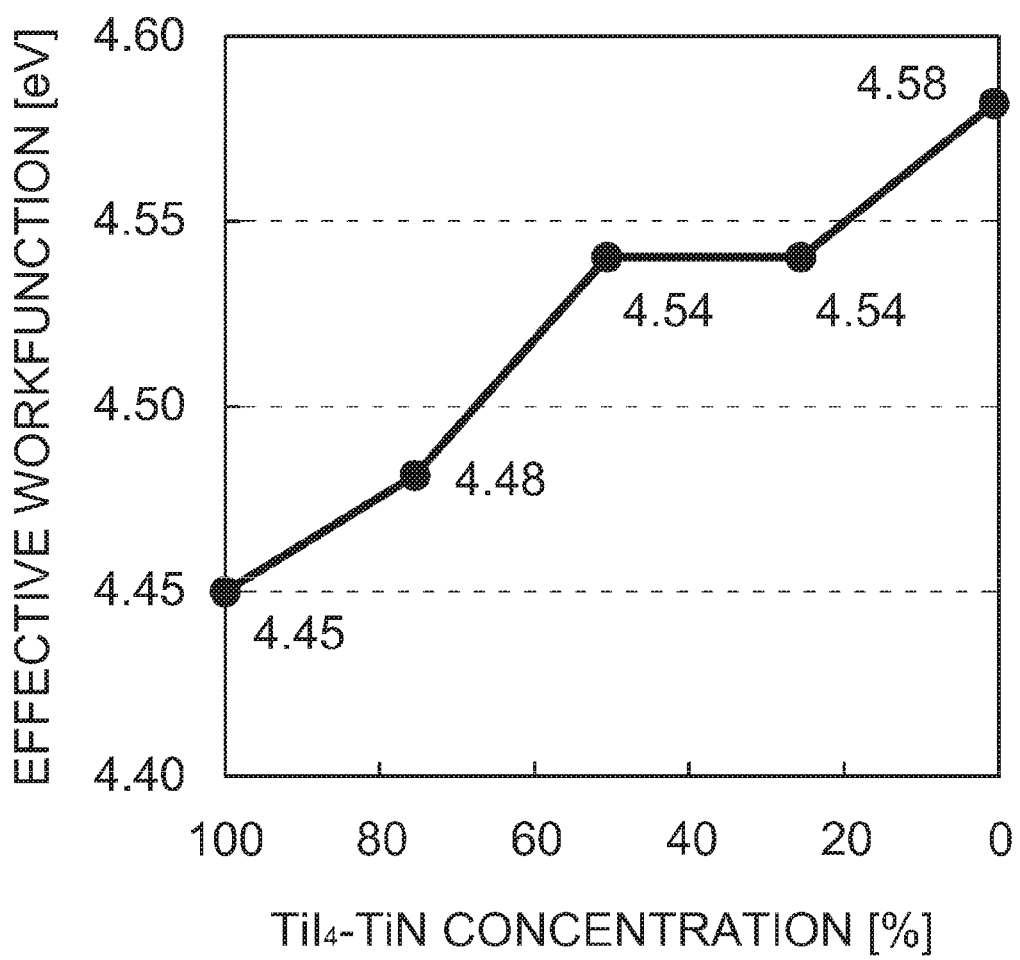
FIG. 7 is a diagram illustrating a work function of a metal nitride film according to the first embodiment described herein.

FIG. 7 is a diagram illustrating the relation between the ratio of the first TiN film included in the stacked TiN film and the work function of the stacked TiN film. Specifically, FIG. 7 illustrates a work function when the ratio of the first TiN film included in the stacked TiN film is changed from 0% to 100% in case where the thickness of the stacked TiN film is set to 6 nm. The work function illustrated in FIG. 7 is an effective work function (eWF) when the $HfO_2$ film as a high-k film is used, and includes a dipole at the interface between the $HfO_2$ and the $SiO_2$ film. FIG. 8 shows the values of X, Y and Z when the eWF of FIG. 7 is obtained. In FIG. 8, the value of Z when the eWF of FIG. 7 is obtained is indicated by "Example 1". The process conditions of the first and second TiN films are as follows.

[First TiN Film]

Process temperature (film forming temperature) . . . 400[° C.], process pressure . . . 60[Pa], $TiI_4$ supply time duration . . . 15[sec], flow rate of TiI4 . . . approximately 1[sccm], $NH_3$ supply time duration . . . 20[sec], flow rate of $NH_3$. . . 300[sccm]

[Second TiN Film]

Process temperature (film forming temperature) . . . 400[° C.], process pressure . . . 60[Pa], $TiCl_4$ supply time duration . . . 2[sec], flow rate of $TiCl_4$ . . . approximately 5[sccm], $NH_3$ supply time duration . . . 20[sec], flow rate of $NH_3$ . . . 300[sccm]

As illustrated in FIG. 7, the higher the ratio of the first TiN film included in the stacked TiN film, the lower the work function of the stacked TiN film. Specifically, as the ratio of the first TiN film increases or the ratio of the second TiN film decreases, the work function of the stacked TiN film approaches the specific work function of the first TiN film (4.45[eV] in the example of FIG. 7). On the other hand, as the ratio of the first TiN film decreases or the ratio of the second TiN film increases, the work function of the stacked TiN film approaches the specific work function of the second TiN film (4.58[eV] in the example of FIG. 7).

Figures 9, 10:
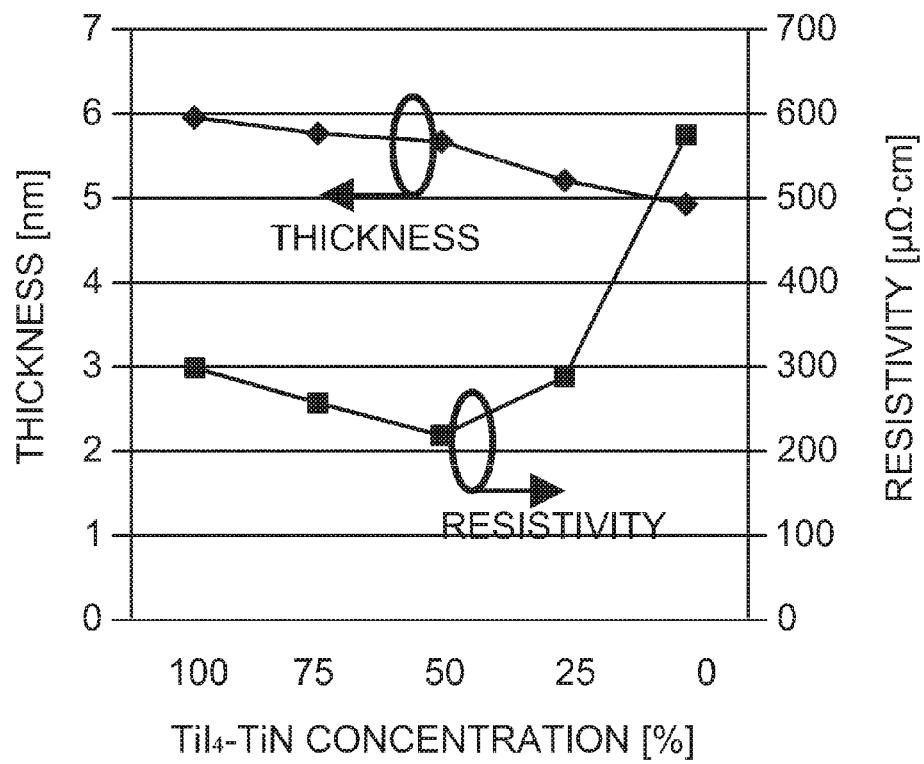
FIG. 9 is a diagram illustrating the resistivity and thickness of the metal nitride film according to the first embodiment described herein.
FIG. 10 is a table showing the roughnesses of first and second metal nitride films constituting the metal nitride film according to the first embodiment described herein.

FIG. 9 is a diagram illustrating the resistivity and thickness of the stacked TiN film when the ratio of the first and second TiN films included in the stacked TiN film is changed. FIG. 8 shows the values of X, Y and Z of the stacked TiN film when the values of FIG. 9 are obtained. In FIG. 8, the value of Z of the stacked TiN film when the values of FIG. 9 are obtained is indicated by "Example 2". The process conditions of the first and second TiN films are the same as described above. As illustrated in FIG. 9, when the ratio of the first TiN film included in the stacked TiN film is equal to or more than a predetermined ratio, the resistivity is significantly lowered. Specifically, when the ratio of the first TiN film included in the stacked TiN film is equal to or more than 25%, the resistivity is lower than 300[$\mu\Omega\cdot$cm]. The reason that the resistivity is lower than 300[$\mu\Omega\cdot$cm] is considered to be because the resistivity of the first TiN film is different from the resistivity of the second TiN film, that is, the resistivity of the first TiN film is lower than the resistivity of the second TiN film. Preferably, the resistivity of the gate element may be set to a low value. When the ratio of the first TiN film included in the stacked TiN film is equal to or more than 25% (eWF is adjusted in a region of not more than 4.54[eV]), the work function can be adjusted, and an electrical characteristic of low resistance can be obtained.

As illustrated in FIG. 9, the higher the ratio of the first TiN film included in the stacked TiN film, the larger the thickness of the stacked TiN film. The binding energy of the halogen element in $TiI_4$ is smaller than the binding energy of the halogen element in $TiCl_4$. Thus, when $TiI_4$ is used under the same process condition, a larger amount of Ti-containing layer is formed than when $TiCl_4$ is used. The binding energy between Ti and a halogen element decreases as the atomic number of the halogen element is high. For example, while the binding energy between Ti and Cl in $TiCl_4$ is 494[kJ/mol], the binding energy between Ti and I in $TiI_4$ is 310[kJ/mol]. When the ratio of the first TiN film included in the stacked TiN film is equal to or more than 25% as illustrated in FIG. 9, the thickness of the film, that is, the film forming rate is significantly improved. Thus, when the ratio of the first TiN film included in the stacked TiN film is equal to or more than 25% (eWF is adjusted in a region of not more than 4.54[eV]), the work function can be adjusted, and the film forming rate can be significantly improved. As described above, the reason that the ratio of I contained in the first TiN film is lower than the ratio of Cl contained in the second TiN film is considered to be because the binding energy of the halogen element in $TiI_4$ is relatively small and thus I is more efficiently separated from Ti.

Next, the reason that the stacked TiN film forming step of FIG. 5 begins with the film forming step using $TiI_4$ as a source (first TiN film forming step) will be described. When $TiI_4$ is used as described above, the halogen element may diffuse in a direction to lower the work function, and a fixed charge at the interface between the $SiO_2$ film and the $HfO_2$ film may be changed. This is considered to be one of the reasons that the work function of the first TiN film is lower than the work function of the second TiN film. Thus, in order to increase the adjustment width by lowering the work function, the stacked TiN film forming step may begin with the film forming step using $TiI_4$ as a source, such that the halogen element of $TiI_4$ is diffused to the interface between the $SiO_2$ film and the $HfO_2$ film through the $HfO_2$ film.

The present inventor found that the roughness (surface roughness) of the first TiN film is better than that of the second TiN film. FIG. 10 is a table showing the roughnesses of the first and second TiN films, which are results measured by AFM (Atomic Force Microscopy). FIG. 8 shows the values of X, Y and Z of the stacked TiN film when the values of FIG. 10 are obtained. The value of Z of the stacked TiN film when the values of FIG. 10 are obtained is indicated by "Example 1" in FIG. 8. The process conditions of the first and second TiN films are the same as described above.

As illustrated in FIG. 10, the mean surface roughness Ra, the root mean square surface roughness (RMS), and the maximum level difference Rmax in surface of the first TiN film are more excellent than those of the second TiN film. This is considered to be because, since the binding energy of the halogen element in $TiI_4$ is smaller than that in $TiCl_4$, the initial nucleation density on the gate insulation film is set to a high value. Thus, by beginning with the film forming step using $TiI_4$ as a source (performing initial film formation using $TiI_4$ as a source), the roughness of a film formed afterwards can be improved. As a result, the entire roughness of the stacked TiN film can be improved. As the roughness of the stacked TiN film is improved, the adhesion between the stacked TiN film and the gate insulation film thereunder may be increased. Thus, a peel off of the stacked SiN film can be suppressed. For example, when a thin film such as tungsten (W) is formed on a TiN film according to a device structure such as 3D-NAND, the improvement in the entire roughness of the stacked TiN film can suppress a peel off of the thin film such as W.

According to the first embodiment, the stacked metal nitride film is formed by forming a first metal nitride film and a second metal nitride film, wherein the first metal nitride film us formed by supplying a nitrogen-containing source and a first metal source containing a first halogen element and a predetermined metal element, and the second metal nitride film is formed by supplying the nitrogen-containing source and a second metal source containing a second halogen element different from the first halogen element and the predetermined metal element. Then, the work function of the metal film can be adjusted.

Furthermore, beginning with a film forming process using a source containing a halogen element having a high atomic number can expand the adjustment width of the work function, improve the roughness of the stacked TiN film, or suppress a peel off of the stacked TiN film.

When a new material is employed in an existing production line, a problem of integration (processing, thermal stability or diffusion stability) may occur. However, since the film forming process of the first embodiment is based on a film forming process of a TiN film which is an existing metal nitride film formed by $TiCl_4$ as a source, the integration problem can be avoided.

The technique described herein may be embodied by changing a process recipe through a modification in gas supply system of an existing substrate processing apparatus in a semiconductor device manufacturing factory. When the process recipe is changed, the process recipe according to the technique described herein may be installed in the existing substrate processing apparatus through an electrical communication line or a recording medium storing the process recipe, or an I/O device of the existing substrate processing apparatus may be operated to change the process recipe into the process recipe according to the technique described herein.

Although the technique has been described while various film forming processes were exemplified, the technique described herein is not limited to the film forming processes. For example, in the embodiments, a single-wafer type substrate processing apparatus has been exemplified. However, the technique described herein can also be applied to a substrate processing apparatus such as a vertical processing apparatus which processes a plurality of substrates at a time.

The technique described herein can be used in a substrate processing apparatus for processing a substrate such as a silicon wafer or a method of manufacturing a semiconductor device.

What is claimed is:

1. A method of manufacturing a semiconductor device, comprising: forming a stacked metal nitride film comprising a first metal nitride film and a second metal nitride film on a substrate by alternately performing steps (a) and (b) a plurality of times, wherein the step (a) comprises alternately supplying: a first metal source containing a first halogen element and a metal element; and a nitrogen-containing source to the substrate a plurality of times to form the first metal nitride film, and the step (b) comprises alternately supplying: a second metal source containing a second halogen element different from the first halogen element and the metal element; and the nitrogen-containing source to the substrate a plurality of times to form the second metal nitride film.

2. The method of claim 1, wherein atomic number of the first halogen element is higher than that of the second halogen element.

3. The method of claim 2, wherein the step (a) starts first when forming the stacked metal nitride film.

4. The method of claim 1, wherein atomic number of the first halogen element is higher than that of the second halogen element, and the second halogen element comprises chlorine.

5. The method of claim 1, wherein the first halogen element comprises iodine.

6. The method of claim 1, wherein the metal element comprises one selected from a group consisting of titanium, tungsten, tantalum, zirconium, hafnium, ruthenium, cobalt and nickel.

7. The method of claim 6, wherein the first metal source comprises titanium iodide, and the second metal source comprises titanium chloride.

8. The method of claim 1, wherein a temperature of the substrate ranges from 350° C. to 400° C. when forming the stacked metal nitride film.

9. The method of claim 1, wherein a work function of the first metal nitride film is different from a work function of the second metal nitride film.

10. The method of claim 1, wherein a resistivity of the first metal nitride film is different from a resistivity of the second metal nitride film.

* * * * *